United States Patent
Xu et al.

(10) Patent No.: US 11,574,090 B2
(45) Date of Patent: Feb. 7, 2023

(54) SYSTEM AND METHOD FOR SIMULATING FIELD DEVICE IN INDUSTRIAL PLANT

(71) Applicant: Yokogawa Electric Corporation, Tokyo (JP)

(72) Inventors: JingXiang Xu, China (CN); Kim Fatt Ng, Singapore (SG); Wei Hong Weng, Singapore (SG)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 642 days.

(21) Appl. No.: 16/558,635

(22) Filed: Sep. 3, 2019

(65) Prior Publication Data
US 2021/0064712 A1    Mar. 4, 2021

(51) Int. Cl.
*G06F 9/44*    (2018.01)
*G06F 30/20*    (2020.01)
(Continued)

(52) U.S. Cl.
CPC ......... *G06F 30/20* (2020.01); *G05B 19/0423* (2013.01); *G05B 23/0289* (2013.01);
(Continued)

(58) Field of Classification Search
CPC ........ G06F 3/1454; G06F 9/451; G06F 30/20; G06F 16/27; G06F 11/3664;
(Continued)

(56) References Cited

U.S. PATENT DOCUMENTS 8,893,013 B1 * 11/2014 Groves ................. G06F 3/1454
715/740
2005/0197803 A1 * 9/2005 Eryurek ............. G05B 23/0289
702/185
(Continued)

OTHER PUBLICATIONS

Stinus et al, "Field Device, Particularly Fluid Level-, Mass Flow-, Pressure-And Temperature Measuring Devices For Recording And Influencing Process Variables, Has Configurator Designed To Execute Configuration Of Field Device", DE 102009028195 (translation), Feb. 17, 2011, 11 pgs <DE_102009028195.pdf>.*
(Continued)

*Primary Examiner* — Tuan A Vu
(74) *Attorney, Agent, or Firm* — Sheridan Ross P.C.

(57) ABSTRACT

In a device engineering method, data of a plant network hierarchy (PNH) and registered devices (RD) in a device management server are synchronized to a device simulation server (SS). In a simulation mode, at least one function of device management system is executed via communicating with simulated devices (SD), while the device management system being not communicatively coupled to any physical control station configured to control physical field devices in a real plant. Virtual parameters are introduced into the SD. For device configuration, simulation is made of configurable device parameters; non-configurable device parameters; and device status, with SD generated from DD files in the PNH for the RD in the FDCS. Parallel communications including sending communication requests from a CRH component to the SD in the PNH from the CRH component in the FDCS to the SD in the PNH are executed simultaneously.

20 Claims, 10 Drawing Sheets

(51) Int. Cl.
  *G06F 16/27* (2019.01)
  *G05B 19/042* (2006.01)
  *G06F 11/36* (2006.01)
  *G05B 23/02* (2006.01)
  *H04L 67/12* (2022.01)
  *G05B 19/418* (2006.01)
  *G06F 9/451* (2018.01)

(52) U.S. Cl.
  CPC .......... *G06F 11/3664* (2013.01); *G06F 16/27* (2019.01); *G05B 19/4185* (2013.01); *G05B 23/02* (2013.01); *G05B 2219/25252* (2013.01); *G05B 2219/25257* (2013.01); *G06F 9/451* (2018.02); *H04L 67/12* (2013.01)

(58) Field of Classification Search
  CPC ................ G05B 23/0272; G05B 23/02; G05B 19/4185; G05B 23/0289; G05B 19/0423; G05B 2219/25252; G05B 2219/25257; H04L 67/10; H04L 67/01
  See application file for complete search history.

(56) References Cited

U.S. PATENT DOCUMENTS

| | | | | |
|---|---|---|---|---|
| 2009/0300578 | A1* | 12/2009 | Neil | G06F 9/451 717/135 |
| 2014/0282257 | A1* | 9/2014 | Nixon | H04L 67/12 715/835 |
| 2015/0227617 | A1* | 8/2015 | Copass | H04L 67/10 707/756 |
| 2016/0179993 | A1* | 6/2016 | Maturana | G06F 30/20 703/7 |
| 2017/0176982 | A1* | 6/2017 | Lutz | G05B 19/4185 |
| 2018/0109955 | A1* | 4/2018 | Nixon | H04L 67/01 |
| 2018/0217580 | A1* | 8/2018 | Jundt | G05B 23/02 |
| 2019/0011906 | A1* | 1/2019 | Baret | G05B 23/0272 |
| 2020/0210328 | A1* | 7/2020 | Shaw | G06F 11/3664 |

OTHER PUBLICATIONS

Maneval et al, "Method For Improving a Diagnostic Function Of a Field Device", DE 102007041240 (translation), Mar. 5, 2009, pp. 1-18 <DE_102007041240.pdf>.*

Communication dated Nov. 23, 2020, from the European Patent Office in European Application No. 20177899.0.

Anonymous, "DeltaV Distributed Control System Product Data Sheet S-series Virtual I/O Module 2", Dated Dec. 31, 2018, Retrieved from the Internet:URL:https://www.emerson.com/documents/automation/product-data-sheet-s-series-virtual-i-o-module-2-deltaven-57730.pdf, Retrieved on Apr. 2, 2020.

Martin Berutti, "Software Acceptance Testing with Mimic Simulation Software MYNAH Technologies, LLC", Dated Jan. 1, 2017, Retrieved from the Internet URL:https://www.mynah.com/content/software-acceptance-testing-mimic-simulation-software Retrieved on Jan. 31, 2020.

* cited by examiner

FIG. 5

| | | | |
|---|---|---|---|
| Poll addr (polling_address) | | | |
| PV (primary_value) | 0.0 | | 0.0 |
| SV (secondary_value) | 0.0 | | 0.0 |
| TV (tertiary_value) | 0.0 | | 0.0 |
| 4V (quaternary_value) | 0.0 | | 0.0 |
| Tag (tag) | | | |
| Distributor (private_label_distributor) | 0x00 | | 0x00 |
| Model (device_type) | FLEXXXXX | | FLEXXXXX |
| Date (date) | 1/1/1972 | | 1/1/1972 |
| Descriptor (descriptor) | | | |
| Message (message) | MSG | | MSG |
| Write protect (write_protect) | No | | No |
| Manufacturer (manufacturer_id) | 0x00 | | 0x00 |
| Dev id (device_id) | 1539XXXX | | 1539XXXX |
| Universal rev (universal_revision) | 8 | | 8 |
| Fld dev rev (transmitter_revision) | 1 | | 1 |
| Software rev (software_revision) | 1 | | 1 |
| Num req preams (request_preambles) | 10 | | 10 |
| Status group 0 (device_specific_status_0) | 0x00 | | 0x00 |
| Status group 1 (device_specific_status_1) | 0x00 | | 0x00 |
| Status group 2 (device_specific_status_2) | 0x00 | | 0x00 |
| Status group 3 (device_specific_status_3) | 0x00 | | 0x00 |
| Update Device Values | | | Download Checked Parameters |

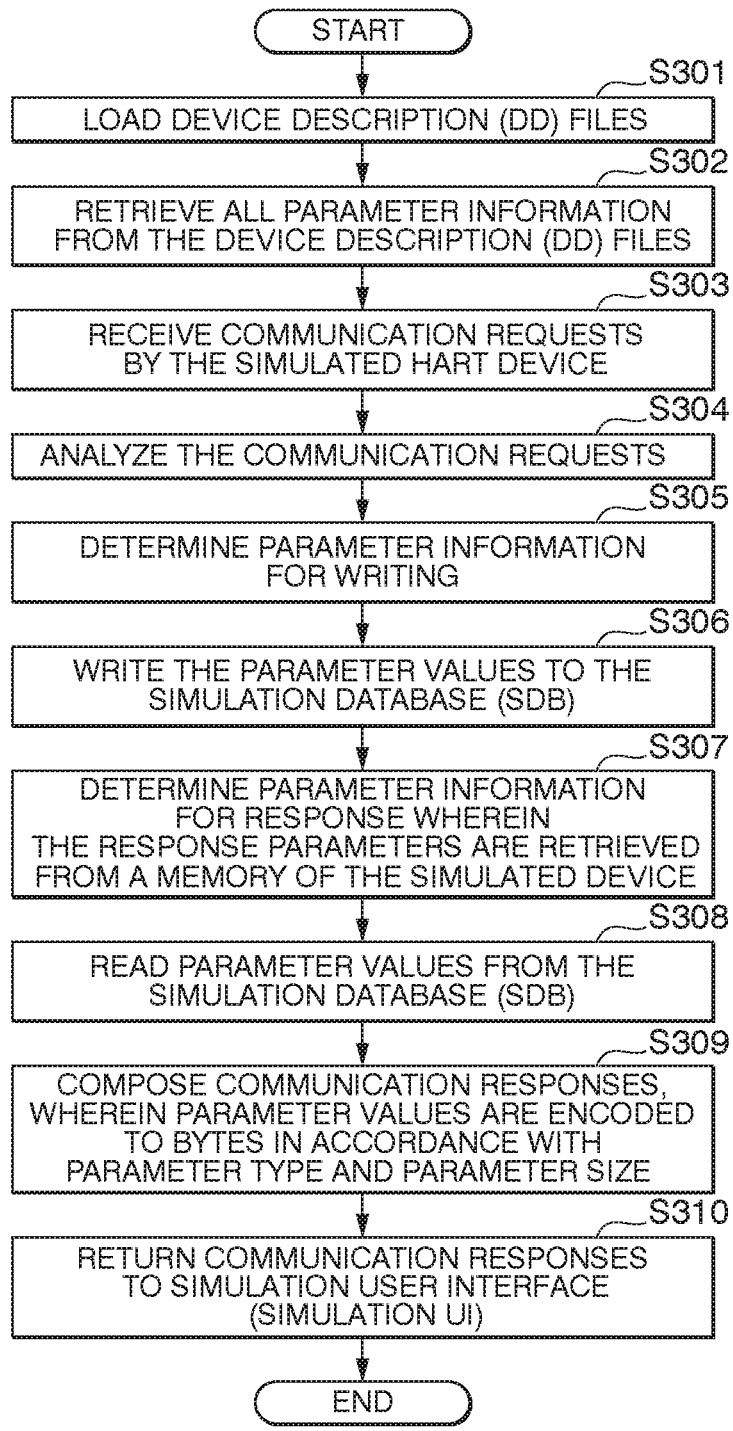

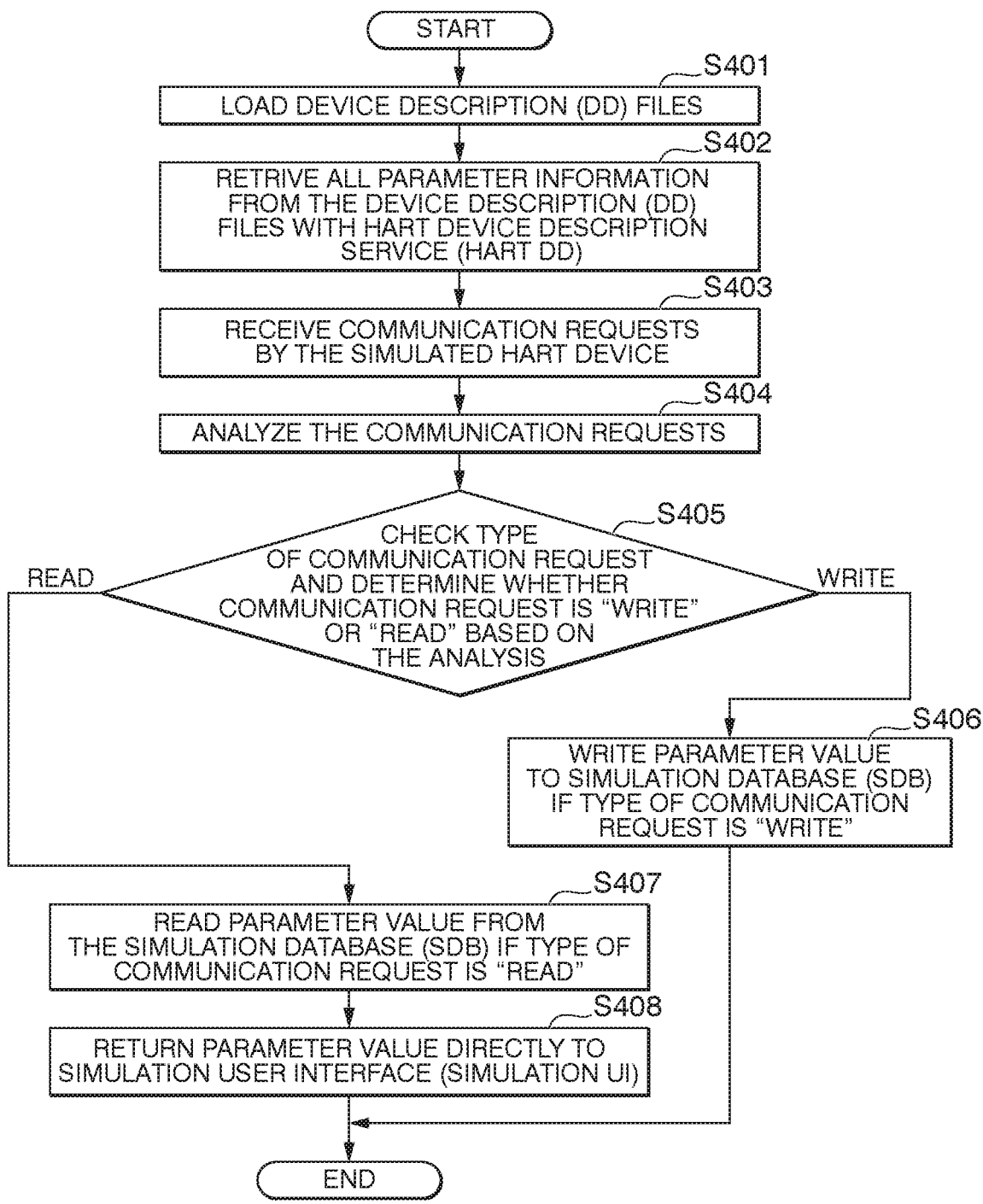

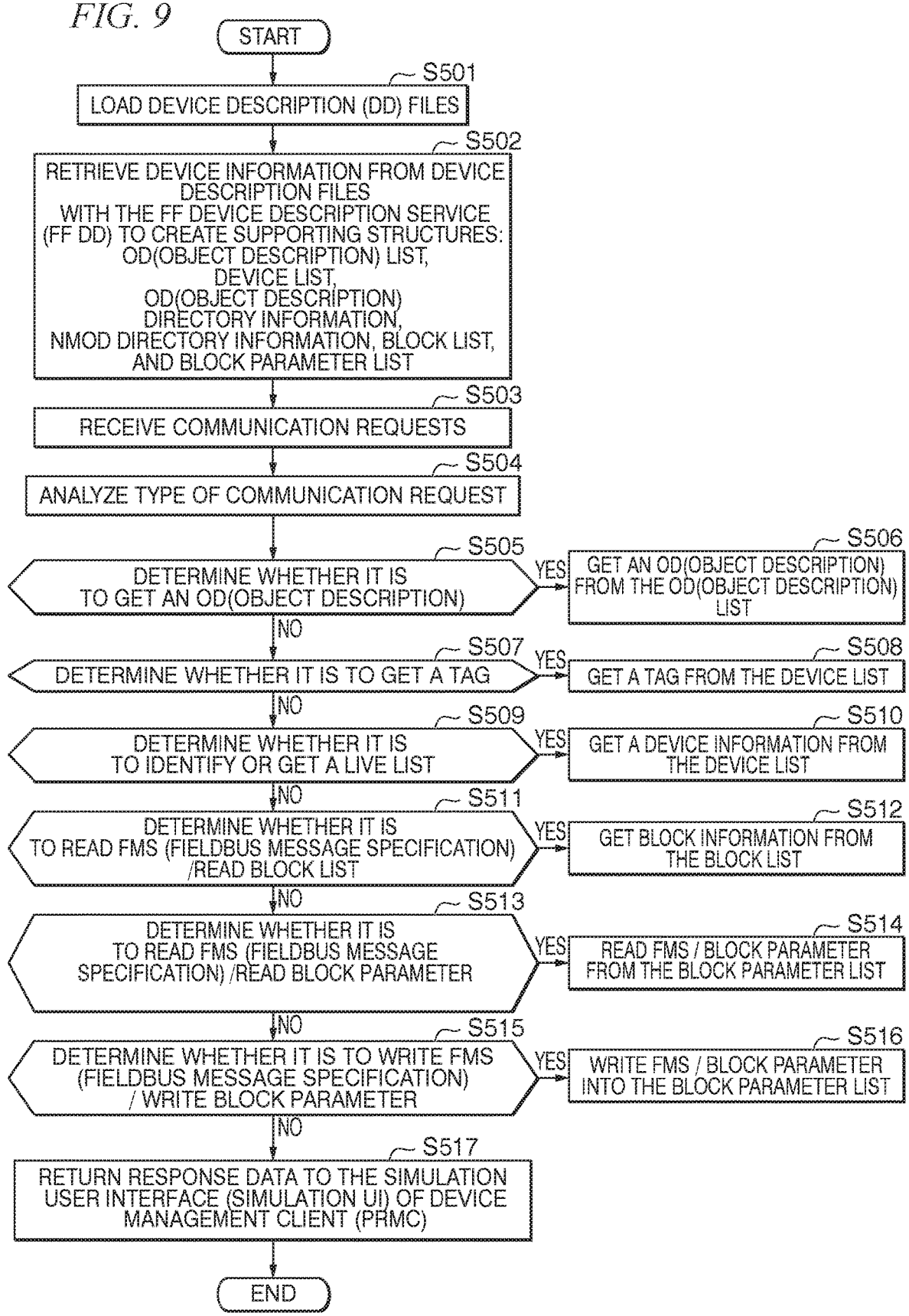

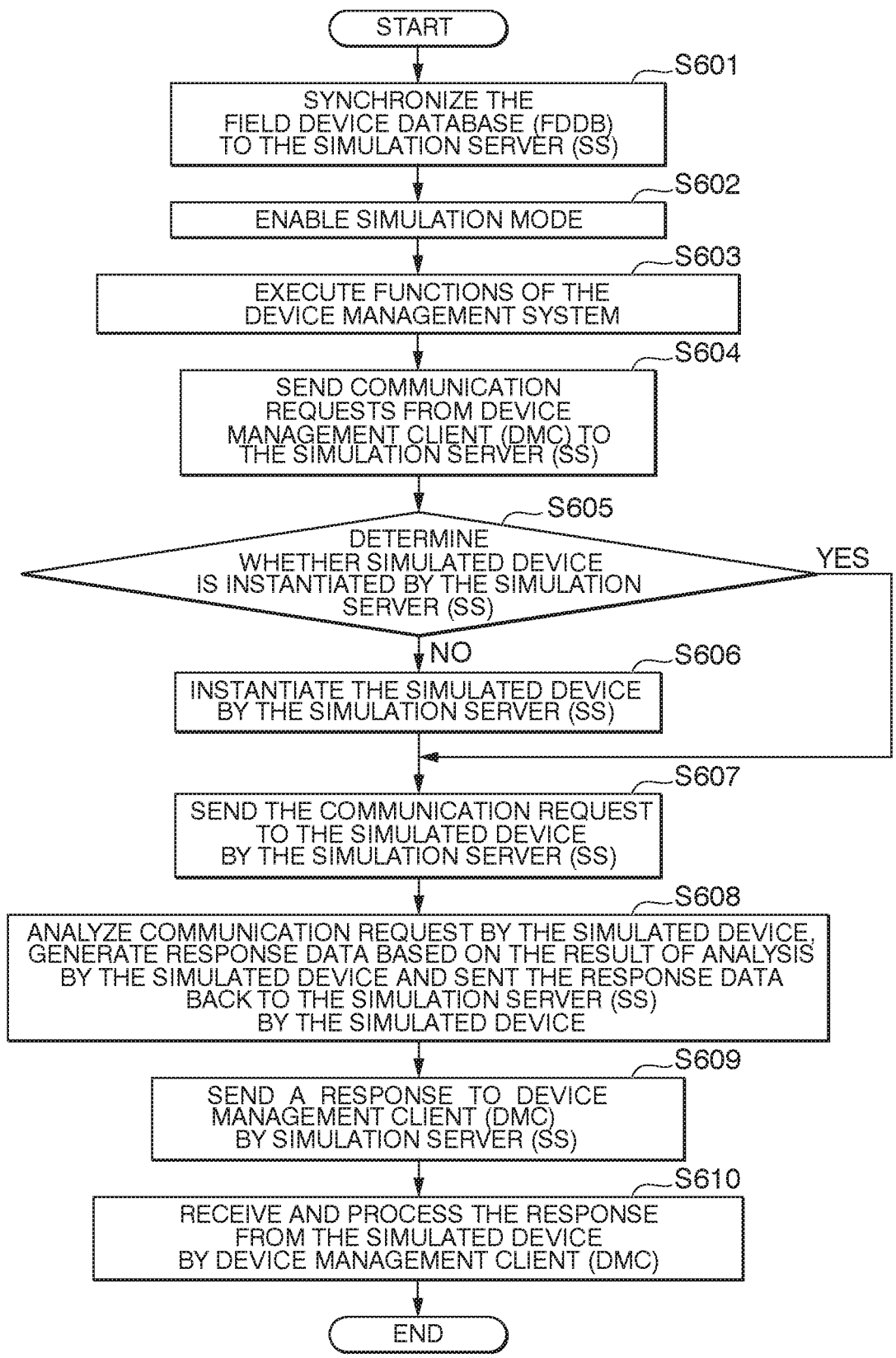

US 11,574,090 B2

SYSTEM AND METHOD FOR SIMULATING FIELD DEVICE IN INDUSTRIAL PLANT

TECHNICAL FIELD

Embodiments of the present invention generally relate to a system and a method for field devices in an industrial plant.

BACKGROUND ART

In an industrial plant, device engineering has to be performed with a large amount of works by engineers because it is hard for engineers to carry out functions of device management system, for example, carry out system configurations, behavior check-up even in the absence of physical devices, and some functions might not be able to be launched. For the purpose of device engineering, simulation of device communication to vast number of field device with different types are needed. Hardware simulator has been available for supporting limited functions and limited devices which are currently available on the market. However, hardware simulator is normally used for simulation functions of particular devices.

SUMMARY

In some embodiments, a device engineering method includes the following processes. Data of a plant network hierarchy (PNH) and data of one or more registered devices (RD) in a database of a device management server (DMS) are synchronized to a device simulation server (SS). In a simulation mode, execution is made of at least one function of the device management system via communicating with simulated devices (SD), while the device management system being not communicatively coupled to any physical control station configured to control one or more physical field devices in a real plant. Virtual parameters are introduced into the simulated devices (SD). For device configuration, simulation is made of i) value change of configurable device parameters; ii) value change of non-configurable device parameters such as process variables; and iii) device status simulation, with simulated devices (SD) generated from one or more device description files (DD files). Simulated devices (SD) under the simulated plant network hierarchy (SIMULATED PNH) in the simulation server (SS) are corresponding to one or more registered devices (RD) with which normally the field device communication server (FDCS) in the device management system communicates. There are parallel communications executed from communication request handling component (CRH) in the field device communication server (FDCS) to the simulated devices (SD) in the plant network hierarchy (PNH) in the simulation server (SS) simultaneously. The parallel communications enables sending multiple communication requests from the communication request handling component (CRH) to multiple simulated devices (SD) in the plant network-hierarchy (PNH) in the simulation server (SS).

BRIEF DESCRIPTION OF THE DRAWINGS

FIG. 5 is a view of simulation user interface in which configurable device parameters and non-configurable device parameters displayed on a display screen.

FIG. 7 is a flow chart of the implementation of HART device simulation based on the device description file (command based transaction).

FIG. 8 is a flow chart of process for implementing device simulation with device description file for HART (parameter based transaction).

FIG. 9 is a flow chart of processes for FF-H1 communication simulation.

FIG. 10 is a flow chart of process of communications of the device management system with the simulated devices (SD).

EMBODIMENTS

Figure 1:
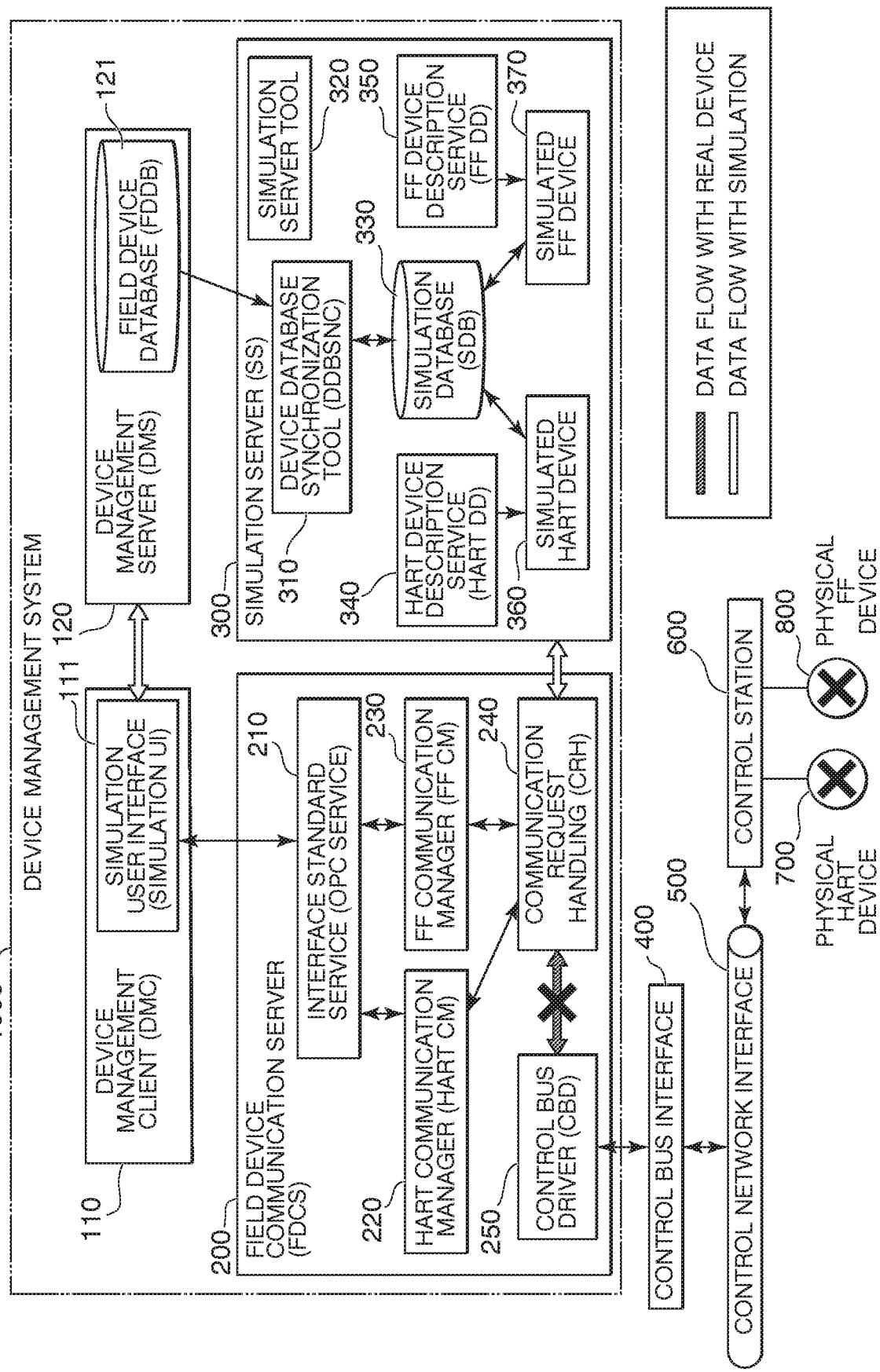
FIG. 1 is a block diagram illustrative of a device management system in some embodiments.

In some aspects, a method and a system are to simulate plant device communication with simulated devices (SD) during device engineering where physical devices are not available. Simulation mode is introduced to a device management system used for device engineering and the field device communication server (FDCS) can be configured to communicate with physical field devices or simulated devices (SD).

In some cases, a method and a system are to simulate any types of device such as FOUNDATION Fieldbus (FF) communication devices and HART communication devices from various vendors, based on information retrieved from device description files. Device configurations and/or parameter values of simulated devices (SD) are stored in a simulation data base.

For FOUNDATION Fieldbus (FF) communication devices, with parameter-based transactions, communications to field device are simulated by read and/or write parameter values including device status from and/or to simulation database.

For HART communication devices, communications to field devices will be simulated by interpreting command structures exposed by device description files and parameter values stored in the simulation database. Virtual parameters are introduced for simulation communication response codes and device statuses. Parameter-based transactions are also supported for HART communication devices to provide integration with various applications.

Data of a plant network hierarchy (PNH) and data of one or more registered devices (RD) in a field device database of a device management server (DMS) are synchronized to a database of a simulation server (SS), prior to simulation of communications to physical devices.

A simulation user interface is provided to allow engineer to change and/or simulate parameter values of configurable and non-configurable parameters, such as PV value as well as device statuses.

In some embodiments, a device engineering method includes the following processes. Data of a plant network hierarchy (PNH) and data of one or more registered devices (RD) in a device management server (DMS) are synchronized to a database of a device simulation server (SS). In a simulation mode, execution is made of at least one function of the device management system via communicating with simulated devices (SD), while the device management system being not communicatively coupled to any physical control station configured to control one or more physical field devices in a real plant. Virtual parameters are introduced into the simulated devices (SD). For device configuration, simulation is made of i) value change of configurable device parameters; ii) value change of non-configurable device parameters; and iii) device status simulation, with simulated devices (SD) generated from one or more device description files (DD files). Simulated devices (SD) in the plant network hierarchy (PNH) in the simulation server (SS) corresponding to registered devices (RD) in the device management system. Parallel communications executed from a communication request handling component (CRH) in the field device communication server (FDCS) to the simulated devices (SD) in the plant network hierarchy (PNH) in the simulation server (SS) simultaneously. The parallel communications include sending communication requests from the communication request handling component (CRH) to the simulated devices (SD) in the simulated plant network-hierarchy (SIMULATED PNH) in the simulation server (SS).

In some cases, the device engineering method may further include, but is not limited to, determining whether the simulated device (SD) is instantiated in the simulation server (SS).

In some cases, the device engineering method may further include, but is not limited to, instantiating the simulated device (SD) in the simulation server (SS), if it is determined that the simulated device (SD) is not instantiated in the simulation server (SS).

In some cases, the device engineering method may further include, but is not limited to, sending a communication request to the simulated device.

In some cases, the device engineering method may further include, but is not limited to, analyzing the communication request by the simulated device.

In some cases, the device engineering method may further include, but is not limited to, generating and sending a communication response based on result of analysis from the simulated device to the device management system.

In some cases, the device engineering method may further include, but is not limited to, selecting one or more segments in the simulated plant network hierarchy (SIMULATED PNH) in the simulation server (SS).

In some cases, the device engineering method may further include, but is not limited to, selecting the one or more device description files (DD files) in a device description service having one or more device information service libraries.

In some cases, the non-configurable device parameters are read-only device parameters and are unchangeable.

In some cases, the simulated devices (SD) may further include, but is not limited to, a manufacturer information which identifies a manufacturer of the one or more physical field devices; a device type information which identifies device type for the one or more physical field devices; and a device database that stores one or more parameter property retrieved from the one or more device description files (DD files) with a device description service having one or more device information service libraries; configuration values of the simulated device; and parameter values of the simulated device.

In some cases, the device database further stores information of all function blocks and parameters.

In some cases, the device database further stores a parameter type, a parameter size, an offset of parameter for a command transaction for parameters participating in a communication request or a communication response.

In some cases, the simulated device further may include, but is not limited to, logics of access function blocks and individual parameters.

In some cases, the simulated device may further include, but is not limited to, logics of interpreting HART communication request with a device description service having one or more device information service libraries accessing parameter values and HART communication response data.

In some cases, the device engineering method may further include, but is not limited to, creating the plant network hierarchy (PNH) in the device management client (DMC); and registering devices in the database in the device management system to create registered devices in the device management system; and configuring the registered devices by the device management system to create the one or more registered devices (RD) in the database in the device management system, prior to synchronizing the data of the plant network hierarchy (PNH) and the data of the one or more registered devices (RD) to a simulation server (SS).

In some cases, the device engineering method may further include, but is not limited to, switching the communication requests from physical devices which may or may not exists in the plant to the one or more simulated devices (SD) in the simulation server (SS), prior to simulating, for the device configuration, i) the configurable device parameters; ii) the non-configurable device parameters; and iii) the device status.

In some cases, the device engineering method may further include, but is not limited to, determining whether the one or more simulated devices (SD) is found in the simulation server (SS); creating the one or more simulated devices (SD) in the simulation server (SS); and configuring i) configurable device parameters; ii) non-configurable device parameters; and iii) device status, with the one or more simulated devices (SD) created.

In some cases, the device engineering method may further include, but is not limited to, accessing to a simulation database (SDB) in the simulation server (SS); and composing communication responses by the one or more simulated devices (SD).

In some cases, the device engineering method may further include, but is not limited to, simulating devices for device types of at least one of HART devices, FF devices, Profibus devices, and ISA 100.

Simulation of device is performed by configuring device parameters, simulating communication with device, but not simulating the device itself, i.e. internal logic of the device is not simulated.

Device status indicating health condition of a device, but HART device dos not expose a parameter for device status. HART device appends device status to communication response data. As no parameter defined for device status and device status can not be changed by user, a virtual parameter is introduced to simulation database for simulating device health condition. Simulating communication with device by reading and writing the virtual parameter for device status is performed Configurable device parameters are exposed to application for viewing, using and editing, e.g device tag, engineering unit, etc.

Non-Configurable device parameters are exposed to application for viewing and using only, application can not change the value of parameter, e.g temperature.

Virtual parameters are not exposed by device. Virtual parameters are just used for simulating communication with device to access particular device properties, e.g. device status.

For a real device, if application or end user changed a unit of temperature, from degC to degF, and the value of temperature will be changed accordingly.

However, device simulator can not simulate internal logic of device, hence the value of temperature will not be changed even if the unit is changed.

Again we are simulating communication with device by reading and writing the virtual parameters for device status, but not for the device internal logic.

Introducing virtual parameters into the simulated devices (SD) is part of processes for instantiation of a simulated HART device. The overall working flow may include, but is not limited to, synchronizing database, enabling simulation mode, excuting engineering functions, instantiating simulated device, sending request to simulated device, receiving and processing response from the simulated device.

The term "configuration of parameters" is applied to real device for changing values of configurable parameters only. The term "simulation of parameters" is applied to device simulator for changing values of not only configurable parameters, but also non-configurable parameters and device status.

The device engineering method and system as described above will enable engineers to perform field device engineering in parallel with control system engineering such as configuration device, to adjust parameter values, and to check device compatibility and system behavior in the absence of field devices available. More specifically, the device engineering method and system as described above will enable engineers to perform field device engineering in parallel with control system engineering such as configuration device, to adjust parameter values, and to check device compatibility and system behavior, while the device management system being not communicatively coupled to any physical control station configured to control one or more physical field devices in a real plant.

The device engineering method and system as described above will enable engineers to check system behavior when a simulated device is replaced with other simulated device of a different type, wherein any physical device is not presented yet. The device engineering method and system as described above will enable engineers to simulate process variables and device status in a very convenient way in the absence of field devices available. More specifically, the device engineering method and system as described above will enable engineers to simulate process variables and device status in a very convenient way while the device management system being not communicatively coupled to any physical control station configured to control one or more physical field devices in a real plant.

The device engineering method and system as described above will enable engineers to carry out engineering of the device management system as soon as possible even before the real devices are deployed or connected to the system. In other words, the device engineering method and system as described above will enable engineers to carry out engineering of the device management system as soon as possible while the device management system being not communicatively coupled to any physical control station configured to control one or more physical field devices in a real plant.

The device engineering method and system as described above will enable engineers to simulate multiple devices of different types from different vendors in parallel to each other or concurrently.

FIG. 1 is a block diagram illustrative of a device management system in some embodiments.

A device management system 1000 may include, but is not limited to, a device management client (DMC)110, a device management server (DMS) 120, a field device communication server (FDCS) 200, and a simulation server (SS) 300. The device management client (DMC) 110 is communicatively and operationally coupled to the field device communication server (FDCS) 200. The device management server (DMS) 120 is communicatively and operationally coupled to the simulation server (SS) 300.

The device management system 1000 is configured to synchronize data of a plant network hierarchy (PNH) and data of one or more registered devices (RD) in the field device database (FDDB) 121 in the device management server (DMS) 120 to the simulation server (SS) 300. The device management system 1000 is configured to execute, in a simulation mode, at least one function of the device management system 1000 via communicating with simulation server (SS) 300, while the device management system 1000 being not communicatively coupled via a control BUS interface 400 and a control network interface 500 to a control station 600 as a physical control station configured to control one or more physical field devices such as physical HART devices 700 and physical FF devices 800 in a real plant.

The device management system 1000 is configured to introduce virtual parameters into the simulated devices (SD).

The simulation server (SS) 300 is configured to simulate, for device configuration, i) value change of configurable device parameters; ii) value change of non-configurable device parameters; and iii) device status simulation, with simulated devices (SD) generated from one or more device description files (DD files) in the simulated plant network hierarchy (SIMULATED PNH) in the simulation server (SS) 300 for the one or more registered devices (RD) in the device management server (DMS) 120 in the device management system 1000.

The field device communication server (FDCS) 200 and the simulation server (SS) 300 are configured to execute parallel communications from a communication request handling component (CRH) 240 in the field device communication server (FDCS) 200 to the simulated devices (SD) in the simulated plant network hierarchy (SIMULATED PNH) in the simulation server (SS) 300 simultaneously, wherein the parallel communications includes sending communication requests from the communication request handling component (CRH) 240 to the simulated devices (SD) in the simulated plant network-hierarchy (SIMULATED PNH) in the simulation server (SS). The communication requests from the communication request handling component (CRH) 240 can be sent to the simulated devices (SD) in the simulated plant network-hierarchy (SIMULATED PNH) in the simulation server (SS), while the device management system 1000 being not communicatively coupled via a control BUS interface 400 and a control network interface 500 to a control station 600 as a physical control station configured to control one or more physical field devices such as physical HART devices 700 and physical FF devices 800 in a real plant.

The device management system 1000 may include, but is not limited to, a device management client (DMC) 110 and a device management server (DMS) 120. The device management client (DMC) 110 is commutatively and operationally coupled to the device management server (DMS) 120. The device management client (DMC) 110 is commutatively and operationally coupled to the field device communication server (FDCS) 200. The device management server (DMS) 120 is commutatively and operationally coupled to the simulation server (SS) 300. The device management client (DMC) 110 may include, but is not limited to, a simulation user interface (SIMULATION UI) 111. The simulation user interface (SIMULATION UI) 111 can be used to communicate with the device management server (DMS) 120 and the field device communication server (FDCS) 200. The device management server (DMS) 120 may include, but is not limited to, a field device database (FDDB) 121. The device management server (DMS) 120 is configured to allow data of the field device database (FDDB) 121 to be synchronized with the simulation server (SS) 300.

The field device communication server (FDCS) 200 may include, but is not limited to, an interface standard service (OPC SERVICE) 210, a HART communication manager (HART CM) 220, an FF communication manager (FF CM) 230, communication request handling component (CRH) 240, and a control bus driver (CBD) 250. The interface standard service (OPC SERVICE) 210 is configured to perform as an interface between the device management client (DMC) 110 and the HART communication manager (HART CM) 220 and between the device management client (DMC) 110 and the FF communication manager (FF CM) 230. The HART communication manager (HART CM) 220 is configured to manage HART communication between the field device communication server (FDCS) 200 and the physical HART device 700 via the control BUS interface 400, the control network interface 500, and the control station 600 which is configured to control the physical HART device 700. The FF communication manager (FF CM) 230 is configured to manage FF communication between the field device communication server (FDCS) 200 and the physical FF device 800 via the control BUS interface 400, the control network interface 500, and the control station 600 which is configured to control the physical FF device 800.

The communication request handling component (CRH) 240 is commutatively and operationally coupled between the HART communication manager (HART CM) 220 and the control bus driver (CBD) 250. The communication request handling component (CRH) 240 is also commutatively and operationally coupled between the FF communication manager (FF CM) 230 and the control bus driver (CBD) 250. The communication request handling component (CRH) 240 is configured to determine communication requests from the HART communication manager (HART CM) 220 to the physical HART device 700 via the control BUS interface 400, the control network interface 500, and the control station 600 which is configured to control the physical HART device 700. The communication request handling component (CRH) 240 is configured to determine communication requests from the FF communication manager (FF CM) 230 to the physical FF device 800 via the control BUS interface 400, the control network interface 500, and the control station 600 which is configured to control the physical FF device 800. The communication request handling component (CRH) 240 is configured to determine communication requests from the HART communication manager (HART CM) 220 to the simulation server (SS) 300. The communication request handling component (CRH) 240 is configured to determine communication requests from the FF communication manager (FF CM) 230 to the simulation server (SS) 300. The control bus driver (CBD) 250 is used when the HART communication manager (HART CM) 220 communicates to the physical HART device 700. The control bus driver (CBD) 250 is used when the FF communication manager (FF CM) 230 communicates to the physical FF device 800.

The simulation server (SS) 300 may include, but is not limited to, a device database synchronization tool (DDBSNC) 310, a simulation server tool (SST) 320, a simulation database (SDB) 330, a HART device description service (HART DD) 340, an FF device description service (FF DD) 350, a simulated HART device 360, and a simulated FF device 370.

The device management client (DMC) 110 is configured to provide for, device engineers, various functions to create a plant network hierarchy (PNH) and to register registered devices (RD) and to configure the registered devices (RD).

The field device database (FDDB) 121 stores data of a plant network hierarchy (PNH) and data of one or more registered devices (RD).

The field device communication server (FDCS) 200 is configured to manage communication channels to the physical HART device 700 and to the physical FF device 800 via the control BUS interface 400, the control network interface 500, and the control station 600 which is configured to control the physical FF device 800 and the physical HART device 700. The field device communication server (FDCS) 200 is configured to send requests by the device management client (DMC) 110 to the physical HART device 700 and to the physical FF device 800 via the control BUS interface 400, the control network interface 500, and the control station 600. The field device communication server (FDCS) 200 is configured to receive response to the requests, from the physical HART device 700 and from the physical FF device 800 via the control BUS interface 400, the control network interface 500, and the control station 600. The field device communication server (FDCS) 200 is configured to send corresponding functions among the various functions of the device management client (DMC) 110 back to the physical HART device 700 and to the physical FF device 800 via the control BUS interface 400, the control network interface 500, and the control station 600.

The device management system 1000 is configurable to be in simulation mode. The device management client (DMC) 110 is configured to send communication requests to the simulated devices (SD), for example, the simulated HART device 360 and the simulated FF device 370 instead of the physical HART device 700 and the physical FF device 800, when the device management system 1000 is placed in simulation mode.

The simulation server (SS) 300 includes the simulation database (SDB) 330 that stores respective configurations and parameter values for simulated devices (SD).

The simulation server (SS) 300 includes the HART device description service (HART DD) 340 which may be implemented by device information service libraries which are provided by HART Foundation.

The simulation server (SS) 300 includes the FF device description service (FF DD) 350 which may be implemented by device information service libraries which are provided by Fieldbus Foundation Group.

The device database synchronization tool (DDBSNC) 310 is communicatively and operatively coupled to the device management server (DMS) 120 which includes the field device database (FDDB) 121 which stores the registered devices. The device database synchronization tool (DDBSNC) 310 is configured to enable engineers to create simulated plant network hierarchy (SIMULATED PNH) and simulated devices (SD). The device database synchronization tool (DDBSNC) 310 is configured to enable engineers to retrieve information of the plant network hierarchy (PNH) and device parameter values from the field device database (FDDB) 121 for creating the simulated plant network hierarchy (SIMULATED PNH) and the simulated devices (SD). Namely, the device database synchronization tool (DDBSNC) 310 is configured to synchronize data of a plant network hierarchy (PNH) and data of one or more registered devices (RD) in the field device database (FDDB) 121 in the device management server (DMS) 120 to the simulation server (SS) 300. Once the field device database (FDDB) 121 is synchronized to the simulation server (SS) 300, engineer has choices to switch communication requests sent by the device management client (DMC) 110 in the device management system 100 to the simulated devices (SD).

The simulation server (SS) 300 includes the simulation server tool (SST) 320. The simulation server tool (SST) 320 is configured to manage environment of simulation such as simulation project, device turnaround time setting for each device and to provide engineer alternatives in additional to device management so as to manage the simulated plant network hierarchy (SIMULATED PNH)) such as to add, delete and/or modify simulated plant network hierarchy (SIMULATED PNH), IO modules and simulation devices.

The simulation server (SS) 300 is configured to instantiate simulated control stations and simulated devices (SD). The simulation server (SS) 300 is configured to forward communication requests from the field device communication server (FDCS) 200 to simulated devices (SD) and return responses to the field device communication server (FDCS) 200

The field device communication server (FDCS) 200 includes the communication request handling component (CRH) 240. The communication request handling component (CRH) 240 is configured to determine whether communication requests from the device management client (DMC) 110 in the device management system 1000 are sent to the physical HART device 700 and the physical FF device 800, or sent to the simulated HART device 360 and the simulated FF device 370.

The communication request handling component (CRH) 240 may be configured to have a simulation switch table. The simulation switch table is used to determine whether communication is sent to the simulated device (SD) or the physical devices such as physical HART devices 700 and physical FF devices 800 in the plant. Simultaneous communications can be achieved from the device management client (DMC) 110 to the simulated devices (SD) and to the physical devices such as physical HART devices 700 and physical FF devices 800 in the plant simultaneously by enabling and disabling the simulation mode in selective levels in the plant network hierarchy (PNH), from control system type level to device level.

Table 1 shows an example of the simulation switch table.

TABLE 1

| Plant hierarchy node | Simulation Mode Enabled | Remarks |
| --- | --- | --- |
| Control System type 1 | Yes | All devices under this system type connect to simulated device |
| Project 1 | Yes | All devices under this project connect to simulated device |
| Control Station 0101 | Yes | All devices under this station connect to simulated device |
| IOM1 | Not specified | |
| Node 01 | Not specified | |
| Slot 01 | Not specified | |
| Channel 01 | Not specified | |
| Device A | Yes | Connect to Simulated device |
| Device B | No | Connect to physical device |
| Device C | Not specified | Connect to Simulated device |
| Channel 02 | No | All devices under this channel connect to physical device |
| Device M | Yes | Connect to physical device |
| Device N | Yes | Connect to physical device |
| Node 02 | No | All devices under this node connect to physical device |
| Slot 01 | Yes | |
| Channel 01 | Yes | |
| Device P | Yes | Connect to physical device |
| Device Q | Yes | Connect to physical device |
| Control Station 0102 | No | All devices under this station connect to physical device |
| IOM1 | Yes | |
| Node 01 | Not specified | |
| Control System type 2 | No | All devices under this system type connect to physical device |

Each level of the plant hierarchy inherits its parent's simulation mode if not specified by the user and overwrites inherited mode when needed. When the simulation mode of parent levels are enabled, subsequent plant hierarchy node inherits the simulation mode of the parent levels. As shown in Table. 1, when control system type, project 1, control station 0101 enables simulation mode, if IOM 1, Node 01, Slot 01 are unspecified by users, they inherit simulation mode. In device level of the plant hierarchy, communication to the simulated devices (SD) is enabled only if all of its parent levels are enabled with the simulation mode and the device itself is also enabled with the simulation mode. For example, when plant hierarchy node Channel 02 disables simulation mode, communications to Device M and Device N under Channel 02 will only send to physical device and physical device N even when Device M and Device N enable simulation mode.

When parallel communication requests sent from device management client (DMC) 110 to the communication request handling component (CRH) 240, the communication request handling component (CRH) 240 will send the communication requests to the physical devices and/or the simulated devices (SD) based on the simulation switch table. When some of the devices are in device mode, and some are in simulation mode, the communication request handling component (CRH) 240 sends the communication requests to the physical devices and the simulated devices (SD) simultaneously.

The device management system 1000 includes the device management client (DMC) 110. The device management client (DMC) 110 is an enhanced user interface which is configured to allow engineers to simulate values of configurable parameters and non-configurable parameters of the device, as well as device status.

Different from physical field devices such as the physical HART device 700 and the physical FF device 800, the simulated devices (SD) such as the simulated HART device 360 and the simulated FF device 370 are free of any physical hardware resource. The simulated devices (SD) such as the simulated HART device 360 and the simulated FF device 370 are composed of pieces of device information such as manufacturer-related information, device types and device revisions.

Simulation Server (SS) 300 includes the simulation database (SDB) 330. The simulation database (SDB) 330 stores parameter property information retrieved from device description files, such as parameter types, default values etc. The simulation database (SDB) 330 stores configurations and parameter values of simulated devices (SD. The simulation database (SDB) 330 stores, for the simulated HART device 360, information for all command transaction structure: parameter type, parameter size, offset of parameter for a command transaction for parameters participating in communication request or communication response. The simulation database (SDB) 330 stores, for the simulated FF device 370, information of all function blocks and parameters, such as index, sub-index, views in function blocks. The simulation database (SDB) 330 stores, for the simulated HART device 360, logics of interpreting HART communication request, accessing parameter value and composing of HART communication response data. The simulation database (SDB) 330 stores, for the simulated FF device 370, logics of access function blocks and individual parameters: for example, FF network management functions such as get live device list, reading object description; read function block list; and access parameter value with index and sub-index.

Executing Device Engineering:

Executing device engineering with simulated devices (SD) can be implemented in two ways: 1) creating simulated devices (SD) such as the simulated HART device 360 and the simulated FF device 370 with synchronization of the field device database (FDDB) 121 in the device management server (DMS) 120 in the device management system 1000; and 2) creating individual device for simulation with the simulation server tool (SST) 320 in the field device communication server (FDCS) 200.

Creating Simulated Devices with Synchronization of Field Device Database (FDDB):

Normally, devices such as HART device and/or FF device are registered in the device management client (DMC) 110 in the device management system 1000 by manual registration or importation from other projects. The registered devices such as the registered HART device and the registered FF device in the device management client (DMC) 110 can be synchronized to the simulation server (SS) 300, so that in the simulation server (SS) 300 the registered devices can be simulated.

Figure 2:
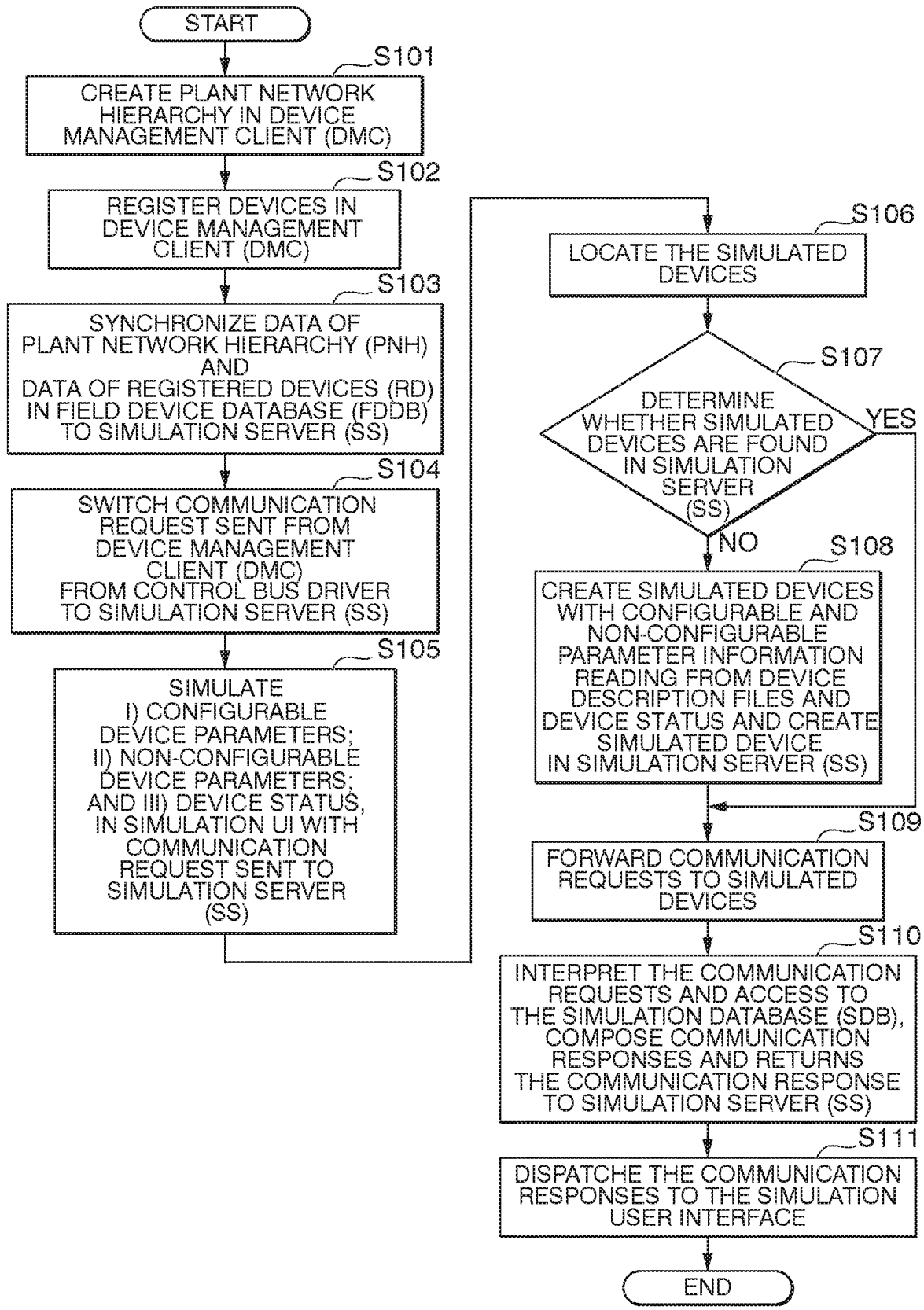
FIG. 2 is a flow chart illustrating operations and procedures of creating simulated devices (SD) with synchronization of the field device database.

FIG. 2 is a flow chart illustrating operations and procedures of creating simulated devices with synchronization of the field device database.

In Step S101, the plant network hierarchy (PNH) is created in the device management client (DMC) 110 in the device management system 1000.

In Step S102, devices such as HART devices and/or FF devices are registered in the device management client (DMC) 110 in the device management system 1000 by manual registration or importation from other projects.

In Step S103, data of a plant network hierarchy (PNH) and data of one or more registered devices (RD) in the field device database (FDDB) 121 in the device management server (DMS) 120 are synchronized to the simulation server (SS) 300 by the device database synchronization tool (DDBSNC) 310.

In Step S104, communication requests sent from device management client (DMC) 110 are switched from the control bus driver (250) in the field device communication server (FDCS) 200 to the simulation server (SS) 300. Communication requests are originated from the device management client (DMC) 110. When simulation mode is enabled, the communication request handling component (CRH) 240 will switch the communication request from the control bus driver (CBD) 250 to the simulation server (SS) 300.

In Step S105, with the communication request sent to the simulation server (SS) 300, by using simulation user interface (SIMULATION UI) 111 to simulate i) value change of configurable device parameters; ii) value change of non-configurable device parameters; and iii) device status simulation, with simulated devices (SD) generated from one or more device description files (DD files) in the plant network hierarchy (PNH) in the simulation server (SS) 300 for the one or more registered devices (RD) in the field device communication server (FDCS) 200 in the device management system 1000.

In Step S106, the simulation server (SS) 300 locates the simulated devices (SD).

In Step S107, it is determined whether the simulated devices (SD) are found in the simulation server (SS) 300.

In Step S108, if it is determined that the simulated devices (SD) are not found in the simulation server (SS) 300 in Step S107, then the simulation server (SS) 300 creates simulated devices (SD) with i) configurable and non-configurable device parameters read out of the device description files; and ii) introduce virtual parameter for HART device status.

In Step S109, after the configuration is made in Step S108, the simulation server (SS) 300 forwards communication requests to the simulated devices (SD) such as the simulated HART device 360 and the simulated FF device 370. If it is determined the simulated devices (SD) are found in the simulation server (SS) 300 in Step S107, then the simulation server (SS) 300 forwards communication requests to the simulated devices (SD) such as the simulated HART device 360 and the simulated FF device 370.

In Step S110, upon receipt of the communication requests by the simulated devices (SD) such as the simulated HART device 360 and the simulated FF device 370, the simulated devices (SD) such as the simulated HART device 360 and the simulated FF device 370 interpret the communication requests and access to the simulation database (SDB) 330. Then the simulated devices (SD) compose communication responses and returns the communication response to the simulation server (SS) 300.

In Step S111, the simulation server (SS) 300 dispatches the communication responses, which have been returned from the simulated devices (SD) such as the simulated HART device 360 and the simulated FF device 370, to the simulation user interface (SIMULATION UI) 111 in the device management client (DMC) 110 in the device management system 1000.

Figure 3:
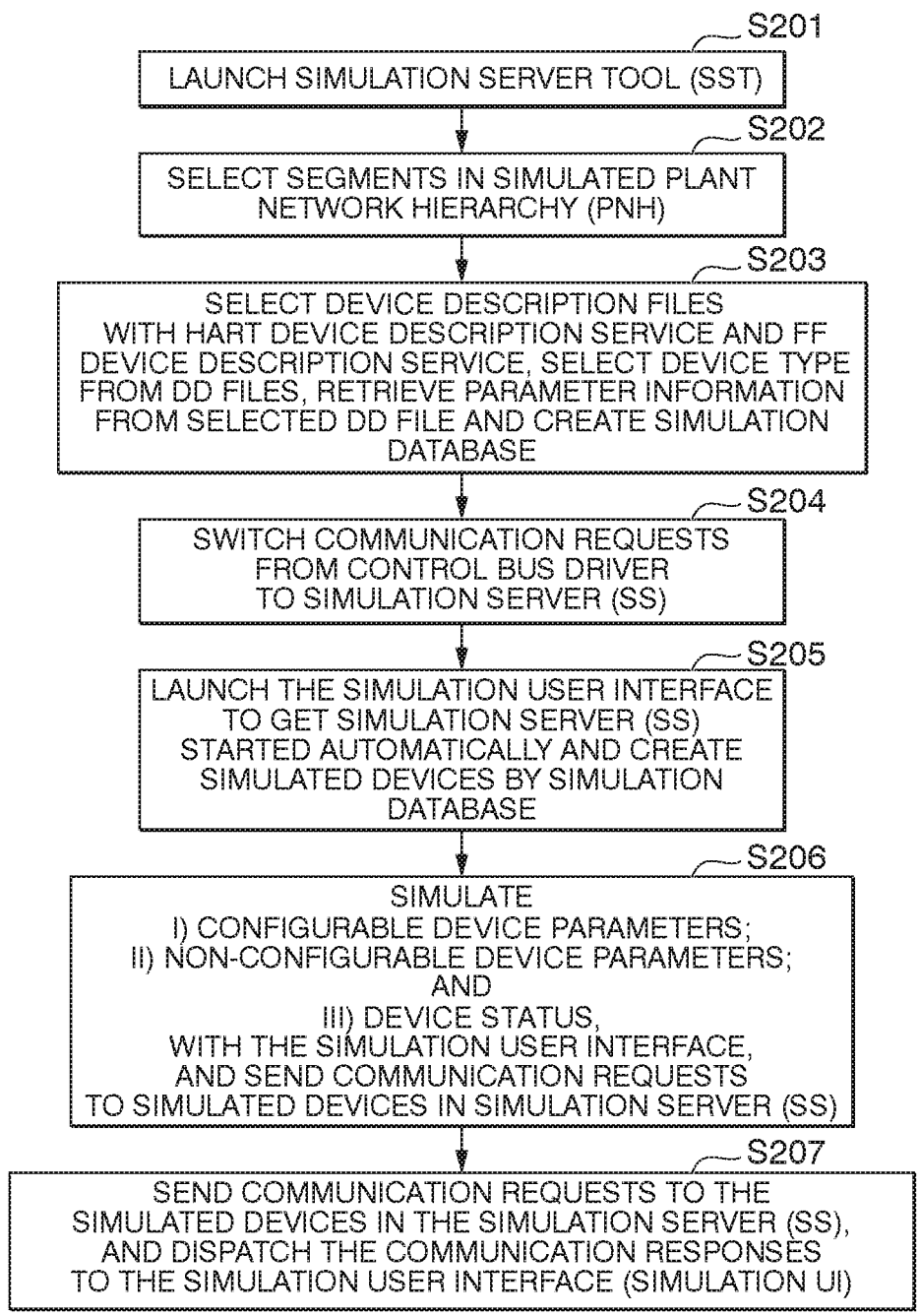
FIG. 3 is a flow chart of process for creating individual device for simulation with the simulation server tool (SST) in the field device communication server (FDCS).
Figure 4:
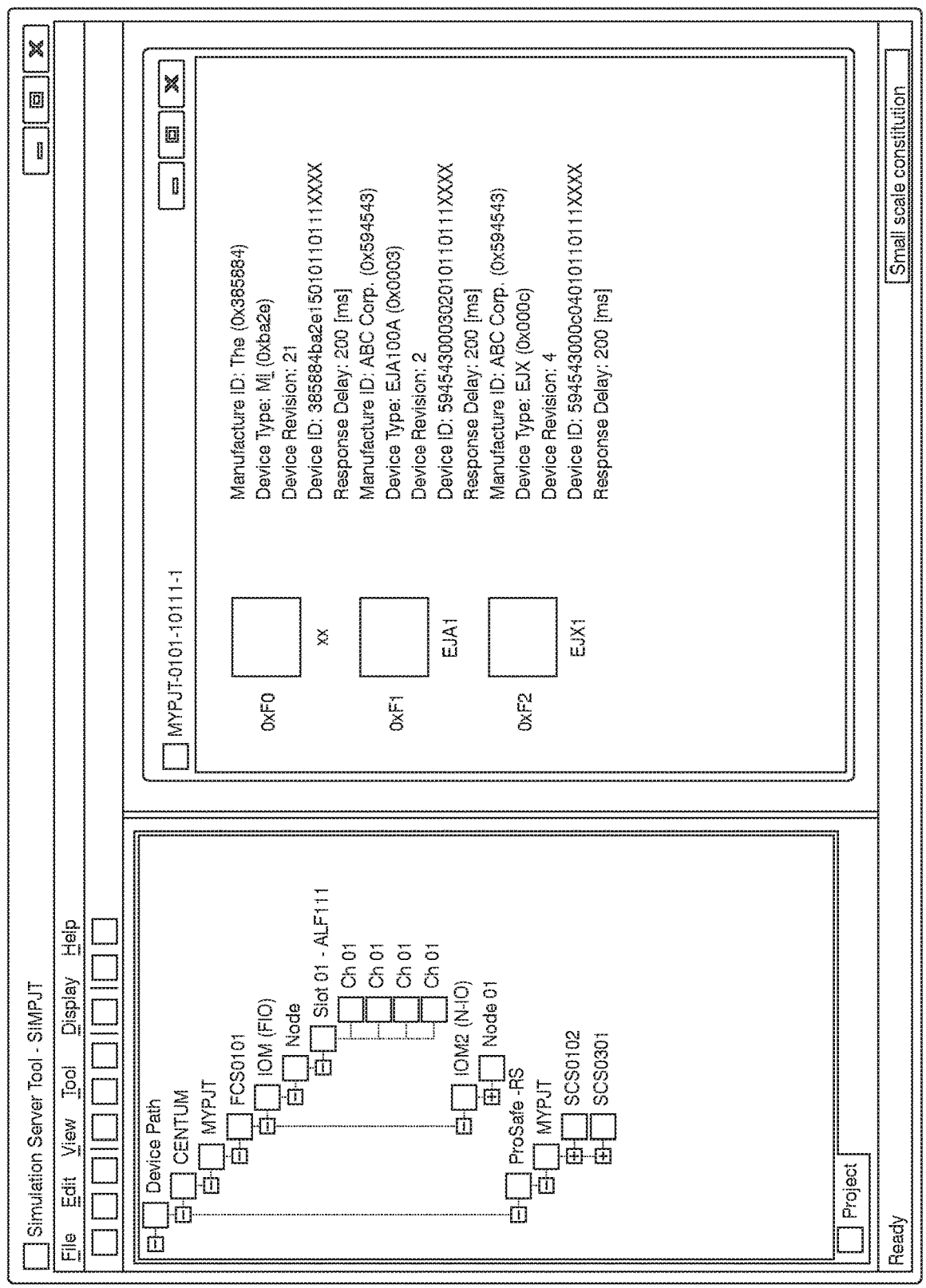
FIG. 4 is a view of an example of a simulation server tool displayed on a display screen.

Creating Individual Device for Simulation with the Simulation Server Tool (SST) 320 in the Simulation Server (SS) 300:

FIG. 3 is a flow chart of process for creating individual device for simulation with the simulation server tool (SST) 320 in the simulation server (SS) 300. FIG. 4 is a view of an example of a simulation server tool (SST) 320 displayed on a display screen.

Besides synchronization of the field device database (FDDB) 121 in the device management server (DMS) 120, engineer is also enabled to add an individual device to simulated plant network hierarchy (SIMULATED PNH) with the simulation server tool (SST) 320.

With reference to FIG. 3, process for creating individual device for simulation with the simulation server tool (SST) 320 in the simulation server (SS) 300 will be described.

In Step S201, the simulation server tool (SST) 320 is launched.

In Step S202, the simulation server tool (SST) 320 selects one or more segments in the simulated plant network hierarchy (SIMULATED PNH) in the simulation database (SDB) 330 in the simulation server (SS) 300.

In Step S203, the simulation server tool (SST) 320 selects device description files (DD files) with the HART device description service (HART DD) 340 and with the FF device description service (FF DD) 350. The simulation server tool (SST) 320 selects a device type from the device description files (DD files). The simulation server tool (SST) 320 retrieves parameter information from the selected device description file (DD file). The simulation server tool (SST) 320 creates the simulation database (SDB) 330.

In Step S204, communication request handling component (CRH) 240 switches communication requests from the control bus driver (CBD) 250 to the simulation server (SS) 300. Communication requests are originated from the device management client (DMC) 110. When simulation mode is enabled, the communication request handling component (CRH) 240 will switch the communication request from the control bus driver (CBD) 250 to the simulation server (SS) 300.

In Step S205, the simulation user interface (SIMULATION UI) 111 is launched to get the simulation server (SS) 300 started automatically and create simulated devices (SD) by the simulation database 330.

In Step S206, by the device simulation server (SS) 300, for device configuration, engineers simulate i) value change of configurable device parameters; ii) value change of non-configurable device parameters; and iii) device status simulation, with the simulation user interface (SIMULATION UI) 111.

In Step S207, functions of the device management client (DMC) 110 in the device management system 1000 are performed. The communication requests are sent to the simulated devices (SD) such as the simulated HART device 360 and the simulated FF device 370 in the simulation server (SS) 300. The simulated devices (SD) compose communication responses and returns the communication response to the simulation server (SS) 300. The simulation server (SS) 300 dispatches the communication responses, which have been returned from the simulated devices (SD) such as the simulated HART device 360 and the simulated FF device 370, to the simulation user interface (SIMULATION UI) 111 in the device management client (DMC) 110 in the device management system 1000.

Simulate Configurable/Non-Configurable Device Parameters:

As described above, i) value change of configurable device parameters; and ii) value change of non-configurable device parameters are simulated.

FIG. 5 is a view of configurable device parameters; and non-configurable device parameters displayed on a display screen.

Non-configurable device parameters may include, but are not limited to, a primary variable value of a field device. Non-configurable device parameters are read-only device parameters and cannot be changed because non-configurable device parameters reflect actual physical-amount measurement as detected by a sensor hardware. In case of a temperature sensor as the field device, non-configurable device parameters include a primary variable value of a temperature sensor device. Non-configurable device parameters are read-only device parameters and cannot be changed because non-configurable device parameters reflect actual temperature measurement as detected by a temperature sensor hardware.

The device simulation provides the way similar to changing configurable parameters, to change the value so that it is possible to simulate any temperature value freely, e.g. 0 degree C., 33 degree C.

The simulation user interface (SIMULATION UI) 111 is configured for engineers to apply different user inputs to various data types, for instancing, string or floating values use text box, enumerated value use dropdown list, bit enumeration uses dedicated dialog, etc. Simulation of any desirable value on read-only parameter is achieved by changing the values in the simulator database.

Simulate Device Status:

HART device status reflects the actual condition or operational status of a device. Device simulation will provide the way to change the device value so that it is possible to simulate any device condition, for example, normal, need for maintenance, device in malfunction.

Figure 6:
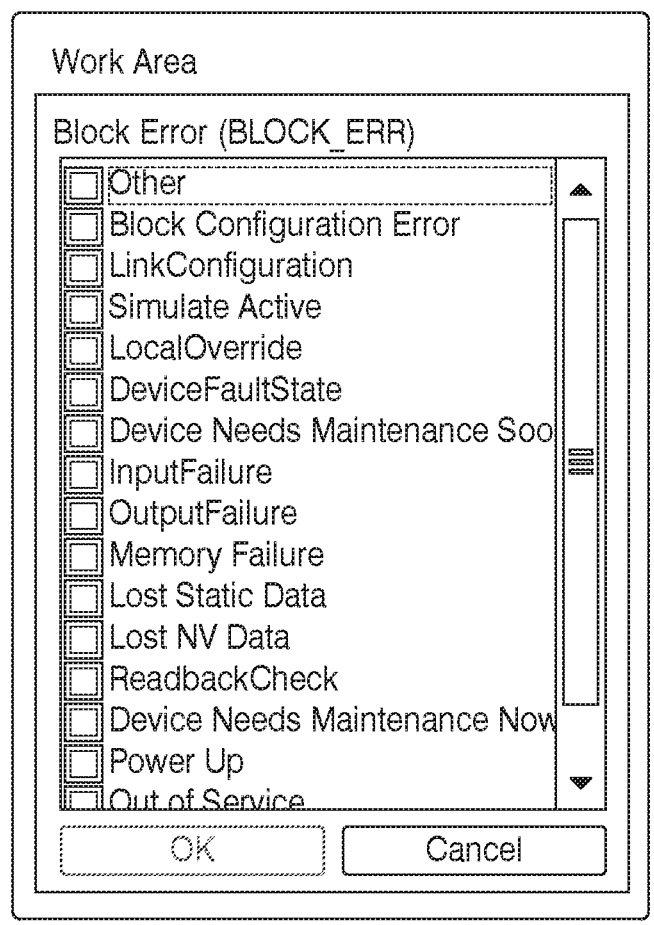
FIG. 6 is a view of an example of simulating device status in a simulation user interface.

FIG. 6 is a view of an example of simulating device status in a simulation user interface.

The simulation user interface (SIMULATION UI) 111 can be used for simulation of device status. Similarly, to other non-configurable parameters, parameter values can be modified and/or simulated in the simulation user interface (SIMULATION UI) 111, and device status can also be simulated. The simulation user interface (SIMULATION UI) 111 will interpret and display each bit of device status, and allow engineers to change the value of each bit of device status, and then save to the simulation database (SDB) 330 for simulation:

Simulate HART Communication with Device Description File:

Simulation functions for simulating HART devices will support both "parameter-based transaction" (OSI Layer 8) and "HART commands" (OSI Layer 7) for HART, so to support a wider range of advanced applications.

The communications between an application (Layer 7) and a HART device may include, but not limited to, requests and responses encoded in HART commands which is basically a stream of binary data.

Normally, HART communication requests sent from an application are processed by the HART device, and the HART device will respond by sending it back the corresponding HART communication response.

In case of device simulation, HART communication requests are processed by the device simulation function. The device simulation function has the logic to interpret the HART communication request and return the corresponding HART communication response. Parameter information for all command transaction structure are retrieved from device description file with the HART device description service (HART DD) 340 when the simulated device 360 is created and kept by the simulated device. The parameter information includes parameter type, parameter size, offset of parameter for a command transaction for parameters participating in communication request or communication response. When communication request received at the simulated devices (SD), the simulated device will handle the request by: the following processes:

1) searching request parameters for the command based on parameter offset in the communication request and parameter size;

2) cutting down bytes of parameter value in the request, decoding parameter value according to parameter type and writing parameter value to simulation database 330;

3) reading parameter values for response parameters from simulation database 330; and 4) encoding parameter values according to parameter type and composing communication response bytes based on parameter offset in the communication response and parameter size.

Simulation functions for simulating HART devices will support universal commands, common practice commands and device-specific commands for any manufacturers and any models, by using device description (DD) information within the device simulation function, as long as device description (DD) information is available.

Some HART field devices do not support all universal commands and common practice commands (HART commands). Device simulation will provide default implementation for these commands (universal command and common practice) according to HART specification provided by HART Foundation when necessary even if those HART devices do not support universal commands and common practice command.

FIG. 7 is a flow chart of the implementation of HART device simulation based on the device description file.

In Step S301, device description (DD) files are loaded to libraries of the HART device description service (HART DD) 340.

In Step S302, all parameter information is retrieved from the device description (DD) files with the HART device description service (HART DD) 340. The parameter information may include, but is not limited to parameter size, parameter type, offset in communication request, and responses, which are kept in any memory of the simulated device.

In Step S303, communication requests are received by the simulated HART device 360.

In Step S304, upon receipt of the communication requests by the simulated HART device 360, the simulated HART device 360 analyzes the communication requests.

In Step S305, the parameter information is determined for writing, wherein the parameter information is retrieved from simulated device memory.

In Step S306, the parameter values are written to the simulation database (SDB) 330, wherein bytes of parameter values are cut down for request parameters based on parameter size and offset in communication request, and parameter values are decoded in accordance with the parameter type.

In Step S307, the parameter information is determined for response, wherein the response parameters are retrieved from a memory of the simulated device.

In Step S308, parameter values are read from the simulation database (SDB) 330.

In Step S309, communication responses are composed, wherein parameter values are encoded to bytes in accordance with the parameter type and parameter size and the bytes are appended to the communication response based on parameter offset in response.

In Step S310, the communication responses are returned to the simulation user interface (SIMULATION UI) 111.

Simulate HART Communication with Device Description File (Parameter Based Transaction)

The term "parameter based transactions" refers to perform to read or write transactions with a device by specifying a parameter name, for example, read "tag_name" or write "message", which otherwise would have to be done by using some low-level protocol-specific commands such as HART command or addressing mechanisms.

FIG. 8 is a flow chart of process for implementing device simulation with device description file for HART (parameter based transaction).

In Step S401, device description (DD) files are loaded.

In Step S402, all parameter information is retrieved from the device description (DD) files with the HART device description service (HART DD) 340. The parameter information may include, but is not limited to parameter size, parameter type, and responses, which are kept in any memory of the simulated device.

In Step S403, communication requests are received by the simulated HART device 360.

In Step S404, upon receipt of the communication requests by the simulated HART device 360, the simulated HART device 360 analyzes the communication requests.

In Step S405, the type of the communication request is checked by the simulated HART device 360 to determine whether the communication request is "write" or "read" based on the analysis of the communication requests by the simulated HART device 360.

In Step S406, if the type of the communication request is determined to be "write", then the parameter value is written to the simulation database (SDB) 330, wherein the parameter value is converted or changed in accordance with the parameter type, and the parameter value is written directly to the simulation database (SDB) 330 without decoding directly bytes needed.

In Step S407 if the type of the communication request is determined to be "read", then the parameter value is read from the simulation database (SDB) 330, wherein the parameter value is read from the simulation database (SDB) 330 and then the parameter value is converted or changed in accordance with the parameter type.

In Step S408, the parameter value is returned directly to the simulation user interface (SIMULATION UI) 111 in the device management client (DMC) 110 without decoding the parameter value to bytes needed.

Simulate FF-H1 Communication with Parameter Based Transaction:

FF-H1 communication simulation is targeted on functions of FF-H1 application layer and user application. FF H1 services are simulation of device address assignment, find tag service, get OD (object description), get NMOD (network management object description), directory information, get OD (object description) directory information, identify the device and/or get live list, read block list and block parameter, and Write block parameter.

FIG. 9 is a flow chart of processes for FF-H1 communication simulation.

In Step S501, device description (DD) files are loaded.

In Step S502, device information is retrieved from device description files of the FF device description service (FF DD) 350 and supporting structures are created of OD (object description) list, device list, OD (object description) directory information, NMOD directory information, block list, and block parameter list.

In Step S503, communication requests are received.

In Step S504, type of the communication request is analyzed.

In Step S505, it is determined whether it is to get an OD (object description).

In Step S506, if it is determined that it is needed to get an OD (object description), then an OD (object description) is gotten from the OD (object description) list.

In Step S507, if it is determined that it is not needed to get any OD (object description), then it is determined whether it is to get a tag.

In Step S508, if it is determined that it is needed to get a tag, then a tag is gotten from the device list.

In Step S509, if it is determined that it is not needed to get any tag, then it is determined whether it is to identify or get a live list.

In Step S510, if it is determined that it is needed to identify or get a live list, then a device information is gotten from the device list.

In Step S511, if it is determined that it is not needed to identify or get a live list, then it is determined whether it is to read FMS (Fieldbus message specification)/read block list.

In Step S512, if it is determined that it is needed to read FMS (Fieldbus message specification)/read block list, then block information is gotten from the block list.

In Step S513, if it is determined that it is not needed to read FMS (Fieldbus message specification)/read block parameters, then it is determined whether it is to read FMS (Fieldbus message specification)/read block parameter.

In Step S514, if it is determined that it is needed to read FMS (Fieldbus message specification)/read block parameter, then block parameter is written into the block parameter list.

In Step S515, if it is determined that it is not needed to read FMS (Fieldbus message specification)/read block parameter, then it is determined whether it is to write FMS (Fieldbus message specification)/write block parameter.

In Step S516, if it is determined that it is needed to write FMS (Fieldbus message specification)/write block parameter, then FMS (Fieldbus message specification)/block parameter is written to the block parameter list.

In Step S517, if it is determined that it is not needed to write FMS (Fieldbus message specification)/write block parameter to the block parameter list, then response data is returned to the simulation user interface (SIMULATION UI) 111 of the device management client (DMC) 110.

Whereas the descriptions have been made in the cases of HART and FF communication protocols, the simulation methods described herein can also be applicable to ISA100 and Profibus.

Device Management System Communication with Simulated Devices:

FIG. 10 is a flow chart of process of communications of the device management system 1000 with the simulated devices (SD).

In Step S601, the field device database (FDDB) 121 of the device management server (DMS) 120 of the device management system 1000 is synchronized to the simulation server (SS) 300.

In Step S602, simulation mode is enabled in the device management system 1000

In Step S603, functions of the device management system 1000 are executed.

In Step S604, communication requests are sent from the device management client (DMC) 110 to the simulation server (SS) 300 by a function of the device management system 1000.

In Step S605, it is determined whether simulated device is instantiated by the simulation server (SS) 300.

In Step S606, if it is determined that the simulated device is not instantiated by the simulation server (SS) 300, then the simulated device is instantiated by the simulation server (SS) 300.

In Step S607, if it is determined that the simulated device is instantiated by the simulation server (SS) 300, then the communication request is sent to the simulated device by the simulation server (SS) 300.

In Step S608, the communication request is analyzed by the simulated device, and response data as a result of analysis is generated by the simulated device and sent back to the simulation server (SS) 300 by the simulated device.

In Step S609, a response is sent to the of the device management client (DMC) 110 by the simulation server (SS) 300.

In Step S610, the response from the simulated device is received and processed by the functions of the device management system 1000.

The systems and methods in the above-described embodiments may be deployed in part or in whole through a machine or circuitry that executes computer software, software components, program codes, and/or instructions on one or more processors. The one or more processors may be part of a general-purpose computer, a server, a cloud server, a client, network infrastructure, mobile computing platform, stationary computing platform, or other computing platform. One or more processors may be any kind of computational or processing device or devices which are capable of executing program instructions, codes, binary instructions and the like. The one or more processors may be or include a signal processor, digital processor, embedded processor, microprocessor or any variants such as a co-processor, for example, math co-processor, graphic co-processor, communication co-processor and the like that may directly or indirectly facilitate execution of program codes or program instructions stored thereon. In addition, the one or more processors may enable execution of multiple programs, threads, and codes. The threads may be executed simultaneously to enhance the performance of the one or more processors and to facilitate simultaneous operations of the application. Program codes, program instructions and the like described herein may be implemented in one or more threads. The one or more processors may include memory that stores codes, instructions and programs as described herein. The processor may access a non-transitory processor-readable storage medium through an interface that may store codes, instructions and programs as described herein and elsewhere. The non-transitory processor-readable storage medium associated with the processor for storing programs, codes, program instructions or other type of instructions capable of being executed by the computing or processing device may include but may not be limited to one or more of a memory, hard disk, flash drive, RAM, ROM, CD-ROM, DVD, cache and the like.

A processor may include one or more cores that may enhance speed and performance of a multiprocessor. In some embodiments, the process may be a dual core processor, quad core processors, other chip-level multiprocessor and the like that combine two or more independent cores.

The methods and systems described herein may be deployed in part or in whole through a machine that executes computer software on a server, client, firewall, gateway, hub, router, or other such computer and/or networking hardware.

The software program may be associated with one or more client that may include a file client, print client, domain client, internet client, intranet client and other variants such as secondary client, host client, distributed client and the like. The client may include one or more of memories, processors, computer readable media, storage media, physical and virtual ports, communication devices, and interfaces capable of accessing other clients, servers, machines, and devices through a wired or a wireless medium, and the like. The programs or codes as described herein may be executed by the client. In addition, other devices required for execution of methods as described in this application may be considered as a part of the infrastructure associated with the client. The client may provide an interface to other devices including servers, other clients, printers, database servers, print servers, file servers, communication servers, distributed servers and the like. This coupling and/or connection may facilitate remote execution of program across the network. The networking of some or all of these devices may facilitate parallel processing of a program or method at one or more location. In addition, any of the devices attached to the client through an interface may include at least one storage medium capable of storing methods, programs, applications, code and/or instructions. A central repository may provide program instructions to be executed on different devices. In this implementation, the remote repository may act as a storage medium for program code, instructions, and programs.

The software program may be associated with one or more servers that may include a file server, print server, domain server, internet server, intranet server and other variants such as secondary server, host server, distributed server and the like. The server may include one or more of memories, processors, computer readable media, storage media, physical and virtual ports, communication devices, and interfaces capable of accessing other servers, clients, machines, and devices through a wired or a wireless medium, and the like. The methods, programs or codes as described herein may be executed by the server. In addition, other devices required for execution of methods as described in this application may be considered as a part of the infrastructure associated with the server. The server may provide an interface to other devices including clients, other servers, printers, database servers, print servers, file servers, communication servers, distributed servers, social networks, and the like. This coupling and/or connection may facilitate remote execution of program across the network. The networking of some or all of these devices may facilitate parallel processing of a program or method at one or more locations. Any of the devices attached to the server through an interface may include at least one storage medium capable of storing programs, codes and/or instructions. A central repository may provide program instructions to be executed on different devices. In this implementation, the remote repository may act as a storage medium for program codes, instructions, and programs.

The methods and systems described herein may be deployed in part or in whole through network infrastructures. The network infrastructure may include elements such as computing devices, servers, routers, hubs, firewalls, clients, personal computers, communication devices, routing devices and other active and passive devices, modules and/or components as known in the art. The computing and/or non-computing devices associated with the network infrastructure may include, apart from other components, a storage medium such as flash memory, buffer, stack, RAM, ROM and the like. The processes, methods, program codes, instructions described herein and elsewhere may be executed by one or more of the network infrastructural elements.

The methods, programs codes, and instructions described herein and elsewhere may be implemented on or through mobile devices. The mobile devices may include navigation devices, cell phones, mobile phones, mobile personal digital assistants, laptops, palmtops, netbooks, pagers, electronic books readers, music players and the like. These devices may include, apart from other components, a storage medium such as a flash memory, buffer, RAM, ROM and one or more computing devices. The computing devices associated with mobile devices may be enabled to execute program codes, methods, and instructions stored thereon. Alternatively, the mobile devices may be configured to execute instructions in collaboration with other devices. The mobile devices may communicate with base stations interfaced with servers and configured to execute program codes. The mobile devices may communicate on a peer to peer network, mesh network, or other communications network. The program code may be stored on the storage medium associated with the server and executed by a computing device embedded within the server. The base station may include a computing device and a storage medium. The storage device may store program codes and instructions executed by the computing devices associated with the base station.

The computer software, program codes, and/or instructions may be stored and/or accessed on machine readable media that may include: computer components, devices, and recording media that retain digital data used for computing for some interval of time; semiconductor storage known as random access memory (RAM); mass storage typically for more permanent storage, such as optical discs, forms of magnetic storage like hard disks, tapes, drums, cards and other types; processor registers, cache memory, volatile memory, non-volatile memory; optical storage such as CD, DVD; removable media such as flash memory, for example, USB sticks or keys, floppy disks, magnetic tape, paper tape, punch cards, standalone RAM disks, Zip drives, removable mass storage, off-line, and the like; other computer memory such as dynamic memory, static memory, read/write storage, mutable storage, read only, random access, sequential access, location addressable, file addressable, content addressable, network attached storage, storage area network, bar codes, magnetic ink, and the like.

The methods, devices, apparatus, and systems described herein may transform physical and/or or intangible items from one state to another. The methods and systems described herein may also transform data representing physical and/or intangible items from one state to another.

The modules, engines, components, and elements described herein, including in flow charts and block diagrams throughout the figures, imply logical boundaries between the modules, engines, components, and elements. However, according to software or hardware engineering practices, the modules, engines, components, and elements and the functions thereof may be implemented on one or more processors, computers, machines through computer executable media, which are capable of executing program instructions stored thereon as a monolithic software structure, as standalone software modules, or as modules that employ external routines, codes, services, or any combination of these, and all such implementations may be within the scope of the present disclosure. Examples of such machines may include, but is not limited to, personal digital assistants, laptops, personal computers, mobile phones, other handheld computing devices, medical equipment, wired or wireless communication devices, transducers, chips, calculators, satellites, tablet PCs, electronic books, gadgets, electronic devices, devices having artificial intelligence, computing devices, networking equipment, servers, routers, processor-embedded eyewear and the like. Furthermore, the modules, engines, components, and elements in the flow chart and block diagrams or any other logical component may be implemented on one or more machines, computers or processors capable of executing program instructions. Whereas the foregoing descriptions and drawings to which the descriptions have been referred set forth some functional aspects of the disclosed systems, no particular arrangement of software for implementing these functional aspects should be inferred from these descriptions unless explicitly stated or otherwise clear from the context. It will also be appreciated that the various steps identified and described above may be varied, and that the order of steps may be adapted to particular applications of the techniques disclosed herein. All such variations and modifications are intended to fall within the scope of this disclosure. The descriptions of an order for various steps should not be understood to require a particular order of execution for those steps, unless required by a particular application, or explicitly stated or otherwise clear from the context.

The methods and/or processes described above, and steps thereof, may be realized in hardware, software or any combination of hardware and software suitable for a particular application. The hardware may include a general purpose computer and/or dedicated computing device or specific computing device or particular aspect or component of a specific computing device. The processes may be realized in one or more microprocessors, microcontrollers, embedded microcontrollers, programmable digital signal processors or other programmable device, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as a computer executable code capable of being executed on a machine readable medium.

The computer executable code may be created using an object oriented programming language that may be stored, and compiled or interpreted to run on one of the above devices, as well as heterogeneous combinations of processors, processor architectures, or combinations of different hardware and software, or any other machine capable of executing program instructions.

Thus, in one aspect, each method described above and combinations thereof may be embodied in computer executable code that, when executing on one or more computing devices, performs the steps thereof. In another aspect, the methods may be embodied in systems that perform the steps thereof, and may be distributed across devices in a number of ways, or all of the functionality may be integrated into a dedicated, standalone device or other hardware. In another aspect, the means for performing the steps associated with the processes described above may include any of the hardware and/or software described above. All such permutations and combinations are intended to fall within the scope of the present disclosure.

While certain embodiments of the present inventions have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A device engineering method comprising:
synchronizing data of a plant network hierarchy (PNH) and data of one or more registered devices (RD), in a database in a device management system, to a simulation server (SS);
executing, in a simulation mode, at least one function of the device management system via communicating with one or more simulated devices (SD), while the device management system being not communicatively coupled to any physical control station configured to control one or more physical field devices for a real plant;
introducing virtual parameters into the one or more simulated devices (SD) for simulation communication response codes and device statuses;
simulating, for device configuration,
  i) configurable device parameters;
  ii) non-configurable device parameters; and
  iii) the device status, with the one or more simulated devices (SD) generated from one or more device description files (DD files) in the plant network hierarchy (PNH) in the simulation server (SS) for the one or more registered devices (RD) in a field device communication server (FDCS) in the device management system; and
executing parallel communications from a communication request handling component (CRH) in the field device communication server (FDCS) to the one or more simulated devices (SD) in the plant network hierarchy (PNH) in the simulation server (SS) simultaneously, wherein the parallel communications comprise sending communication requests from the communication request handling component (CRH) to the one or more simulated devices (SD) in the plant network-hierarchy (PNH) in the simulation server (SS);
wherein simulating the device status comprises:
  responding, by a simulated device of the one or more simulated devices (SD), to a communication request from the communication request handling component (CRH) with communication response data by using the virtual parameters for simulating communication with the simulated device to access the device status.

2. The device engineering method according to claim 1, further comprising:
    determining whether or not the one or more simulated devices (SD) are instantiated in the simulation server (SS).

3. The device engineering method according to claim 2, further comprising:
    instantiating the one or more simulated devices (SD) in the simulation server (SS), if it is determined that the one or more simulated devices (SD) are not instantiated in the simulation server (SS).

4. The device engineering method according to claim 1, further comprising:
    sending the communication request to the one or more simulated devices (SD).

5. The device engineering method according to claim 1, further comprising:
    analyzing the communication request by the one or more simulated devices (SD).

6. The device engineering method according to claim 5, further comprising:
    sending a communication response based on analysis result from the one or more simulated devices (SD) to the device management system.

7. The device engineering method according to claim 1, further comprising:
    selecting one or more segments in the plant network hierarchy (PNH) in the simulation server (SS).

8. The device engineering method according to claim 7, further comprising:
    selecting the one or more device description files (DD files) with a device description service having one or more device information service libraries.

9. The device engineering method according to claim 1, wherein the non-configurable device parameters are read-only device parameters and are unchangeable.

10. The device engineering method according to claim 1, wherein each of the one or more simulated devices (SD) comprise:
    a manufacturer information which identifies a manufacturer of the one or more physical field devices;
    a device type information which identifies a type of the one or more physical field devices; and
    a device database that stores one or more parameter property retrieved from the one or more device description files (DD files); configuration values of each simulated device; and parameter values of each simulated device.

11. The device engineering method according to claim 10, wherein the device database further stores information of all function blocks and parameters.

12. The device engineering method according to claim 11, wherein the device database further stores a parameter type, a parameter size, an offset of parameter for a command transaction for parameters participating in a communication request or a communication response.

13. The device engineering method according to claim 10, wherein the one or more simulated devices (SD) further comprise:
    logics of access function blocks and individual parameters.

14. The device engineering method according to claim 10, wherein the one or more simulated devices (SD) further comprise:
    logics of interpreting HART communication request, accessing parameter values and HART communication response data.

15. The device engineering method according to claim 1, further comprising:
    creating the plant network hierarchy (PNH) in the device management system;
    registering devices in the database in the device management system to create registered devices in the device management system; and
    configuring the registered devices by the device management system to create the one or more registered devices (RD) in the database in the device management system, prior to synchronizing the data of the plant network hierarchy (PNH) and the data of the one or more registered devices (RD) to a simulation server (SS).

16. The device engineering method according to claim 15, further comprising:
    switching the communication requests from a control bus driver to the simulation server (SS), prior to simulating, for the device configuration, i) the configurable device parameters; ii) the non-configurable device parameters; and iii) the device status.

17. The device engineering method according to claim 1, further comprising:
    accessing to a simulation database (SDB) in the simulation server (SS); and
    composing communication responses by the one or more simulated devices (SD).

18. The device engineering method according to claim 1, further comprising:
    simulating devices for device types of HART devices, FF devices, Profibus devices, and ISA 100.

19. A system for simulating plant device communication, comprising:
    one or more processors; and
    memory coupled to the one or more processors, wherein the memory comprises instructions stored therein that, when executed by the one or more processors, enable the one or more processors to:
        synchronize data of a plant network hierarchy (PNH) and data of one or more registered devices (RD), in a database, to a simulation server (SS);
        execute, in a simulation mode, at least one function via communicating with one or more simulated devices (SD), while being not communicatively coupled to any physical control station configured to control one or more physical field devices for a real plant;
        introduce virtual parameters into the one or more simulated devices (SD) for simulation communication response codes and device statuses;
        simulate, for device configuration,
        i) configurable device parameters;
            ii) non-configurable device parameters; and
            iii) the device status, with the one or more simulated devices (SD) generated from one or more device description files (DD files) in the plant network hierarchy (PNH) in the simulation server (SS) for the one or more registered devices (RD) in a field device communication server (FDCS); and
        execute parallel communications from a communication request handling component (CRH) in the field device communication server (FDCS) to the one or more simulated devices (SD) in the plant network hierarchy (PNH) in the simulation server (SS) simultaneously, wherein the parallel communications comprise sending communication requests from the communication request handling component (CRH) to the one or more simulated devices (SD) in the plant network hierarchy (PNH) in the simulation server (SS), when the one or more simulated devices (SD) is determined to be in a simulate mode by a simulation switch table, wherein the simulation switch table is used to determine whether the communication requests are sent to the one or more simulated devices (SD) or the physical field devices.

20. A device engineering method comprising:

sending, by a device management client that manages one or more physical field devices for a real plant, data of one or more registered devices (RD) registered in the device management client to a simulation server (SS), wherein the device management client and the simulation server belong to a device management system;

determining, by a communication request handling component of a field device communication server in communication with the device management client and a control bus interface that communicatively couples to the one or more physical field devices, that the device management system is in a simulation mode;

sending, when the device management system is in the simulation mode and by the communication request handling component, parallel requests to the simulation server to simulate two different types of registered devices in the one or more registered devices; and simultaneously simulating, based on the data and by two simulated devices that correspond to the two different types of registered devices, i) configurable device parameters for the two different types of registered devices; ii) non-configurable device parameters for the two different types of registered devices; and iii) device status for the two different types of registered devices, wherein the simulating occurs while the device management system is not communicatively coupled to any physical control station configured to control the one or more physical field devices.

* * * * *